March 1, 1960 E. L. MARTIN ET AL 2,927,022

PHOTOPOLYMERIZABLE COMPOSITIONS AND ELEMENTS AND PROCESSES OF USING SAME

Filed July 9, 1956 2 Sheets-Sheet 1

INVENTORS

ELMORE LOUIS MARTIN

ARTHUR LIVINGSTON BARNEY

BY Lynn Barratt Morris

ATTORNEY

INVENTORS
ELMORE LOUIS MARTIN
ARTHUR LIVINGSTON BARNEY
BY Lynn Barratt Morris
ATTORNEY

United States Patent Office 2,927,022

Patented Mar. 1, 1960

2,927,022

PHOTOPOLYMERIZABLE COMPOSITIONS AND ELEMENTS AND PROCESSES OF USING SAME

Elmore Louis Martin and Arthur Livingston Barney, Wilmington, Del., assignors to E. I. du Pont de Nemours and Company, Wilmington, Del., a corporation of Delaware

Application July 9, 1956, Serial No. 596,766

13 Claims. (Cl. 96—35)

Figure 1:
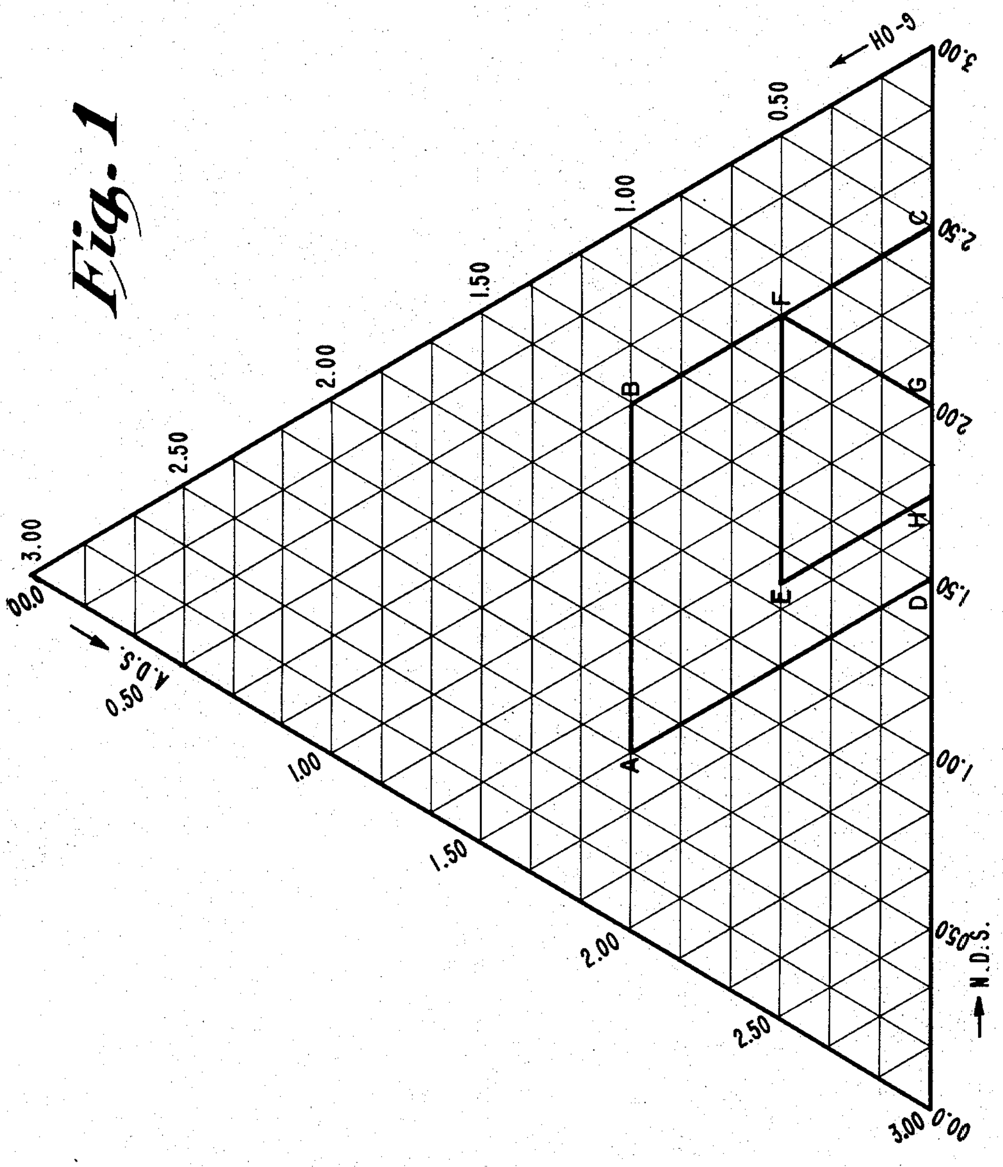

This invention relates to new polymeric compositions and more particularly to certain photosensitive, addition polymerizable, ethylenically unsaturated polymeric compositions that are both organic solvent- and aqueous base-soluble, and to photopolymerizable elements embodying such compositions. The invention also relates to processes of making printing reliefs using such elements and to printing reliefs.

Solid compositions capable of polymerization under the influence of actinic light to rigid, insoluble, tough structures have recently become of increased technical importance in the making of printing plates as described and claimed in the copending application of Plambeck Ser. No. 326,841, filed December 19, 1952 (U.S. Patent 2,791,504 patented May 7, 1957), Belgian Patent 525,225, and British patent specifications 741,441 and 741,470. In the processes of such application and specifications, printing plates with uniform printing height are produced directly by exposing to actinic light through an image-bearing process transparency a layer of an essentially transparent, addition polymerizable, ethylenically unsaturated composition, containing uniformly dispersed therethrough an addition polymerization initiator activatable by actinic light, said layer being superposed on and adherent to a suitable support, until substantially complete polymerization of the composition occurs in the exposed areas with substantially no additional polymerization in the non-exposed areas. Removal of the layer in the latter areas by treatment with a suitable solvent in which the substantially fully polymerized composition in the exposed areas is insoluble leaves a relief image of the text of the transparency suitable for direct use as a printing plate, especially for letterpress work or dry offset.

Such solid photopolymerizable layers have generally been prepared from organic-soluble polymeric components, and therefore development of the printing plate after exposure normally utilizes wholly organic solvents. This introduces undesirable hazards, particularly since the development step will be carried out in the printing shop where the plates are made, which generally will not have the equipment, experience, or safety background of a chemical processing plant.

Photopolymerizable layers which are water or, more generally, aqueous alkali developable are known and in fact do offer distinct advantages in development. However, such desirable development has depended on photopolymerizable layers with such polymeric components as acrylic or methacrylic acid copolymers, or high acid number alkyd resins. Layers based on these polymeric components result in excellent printing reliefs. The compositions of the present invention and the photopolymerizable layers formed therefrom, due to the high degree of compatability between the components thereof, are even more firm, have substantially tack-free surfaces, exhibit no exudation and result in printing reliefs of the highest quality.

A new class of solid, organic-soluble, water or aqueous base-soluble, photopolymerizable compositions has now been discovered. These new compositions are readily processable to film or layer form from solution or by conventional mechanical means, e.g., extruding, calendering, or the like, with or without added plasticizers such as water, and yet in solid layer form they are not unduly water- or moisture-sensitive. After exposure of the photopolymerizable layer through a process transparency, the exposed layers are readily developable with water or aqueous bases to form practical printing reliefs, thus obviating the need for organic solvents, although the latter can be and frequently are used in minor proportions depending on the nature of the organic/aqueous partition solubility of the aqueous base-soluble component, which solubility variations are well known in the art. The printing reliefs obtained have extremely desirable wear characteristics, comparable to copper-faced electrotypes which are much more expensive and far more difficult to prepare. Furthermore, these new compositions can contain relatively large proportions of addition polymerizable, ethylenically unsaturated, low molecular weight components without exhibiting any undesirable loss in physical properties or undue tackiness.

The new compositions of this invention comprise as active constituents (1) an addition polymerization initiator activatable by actinic light, i.e., a photo-initiator, (2) an addition polymerizable ethylenically unsaturated compound of molecular weight less than 1500 having a boiling point higher than 100° C. at normal pressure and preferably containing at least two ethylenic groups, (3) a cellulose derivative containing lateral free oxyacid groups or oxyacid salt groups where the salt-forming cation is an alkali metal, e.g. lithium, sodium, potassium, or is an ammonium or substituted ammonium radical, which is soluble to the extent of at least 10% by weight in 1% aqueous ammonia solution and may contain as inert ingredients up to 35% by weight of inert organic or inorganic filler material. Constituent (2) constitutes 10 to 60% and constituent (3) 40 to 90% by weight of the total composition exclusive of initiator.

The invention also includes elements suitable for the preparation of printing relief images comprising an adherent support having superposed thereon a solid layer of the just described photopolymerizable compositions from 3 to 250 mils in thickness. In a preferred embodiment these elements comprise sheet or plate supports from which no more than 35% of incident actinic light is reflected. When the support material is light-reflective, e.g., metal plates or sheets or foils which are preferred because of their strength and other inherent physical properties, there is present, e.g., superposed on said support and adherent thereto or in the surface thereof, a layer or stratum absorptive of actinic light so as to restrict reflectance from the combined support of again no more than 35% of incident actinic light. Photopolymerizable elements of this general structure are the subject matter of copending Plambeck application Ser. No. 541,-723, filed October 20, 1955, Patent No. 2,791,504.

Cellulose ethers and esters containing lateral acidic groups constitute the preferred polymer component of the photopolymerizable composition. One such cellulose derivative or a mixture of two or more of such ethers or two or more of such esters or a mixture of one, two, or more ethers with one, two, or more esters can be used. These cellulose derivatives are essentially linear polymers of high molecular weight. Generally, the lateral free acid containing substituents are linked to the main cellulose structure through oxygen, including both ether oxygen and ester oxygen, i.e., the lateral free acid-containing groups are linked to the cellulose backbone or polymer chain of atoms through —O— or $$-O\underset{\underset{O}{\|}}{C}-$$

links. The same also holds true for any neutral, generally hydrocarbon, substituent groups present (as will be apparent later) in the cellulose derivative.

More specifically, these acidic cellulose ethers and esters should have a total degree of substitution from 2.00–3.00 and preferably at least 2.50 per glucose unit. Furthermore, the total number of hydroxyl groups, including the terminal hydroxyl portion of the lateral oxyacid groups, should be in the range 0.50–2.50 and preferably 1.00–1.75 per glucose unit. Finally, there should be present sufficient lateral free acid groups so that the cellulose component has a neutral equivalent in the range of 200 to about 700 and preferably in the range 300–500. This corresponds to an acid degree of substitution of from 0.50–1.50 and preferably 0.50–1.25, i.e., that many lateral acid groups per glucose unit. By difference, since there are three hydroxyl groups or substituent groups per glucose unit, the neutral degree of substitution will be from 0.50–2.50, and preferably 1.25–2.00, i.e., that many neutral, preferably hydrocarbon ether or ester, substituents per glucose unit. Generally speaking, the cellulose backbone will be composed of at least 50 combined glucose units and preferably the cellulose degree of polymerization (DP) will range from 75–100 to 400–500 or higher, generally 100–300. These cellulose ethers and esters containing lateral free acid groups, as previously stated, are soluble to the extent of at least 10% by weight in 1% aqueous ammonia. The above limitations are given in terms of the acidic cellulose component and obviously will not apply to the soluble salt components, e.g., the limitations on total number of hydroxyl groups and on neutral equivalent. The soluble salts of these acidic cellulose compounds, i.e., those wherein all or part of the acid groups are involved in salt linkages with alkali metal, ammonium, or substituted ammonium salt groups, can also be used in which case development can be carried out in water alone.

The lateral free acid groups are generally those wherein the acidic hydrogen is linked to the remainder of the molecule through oxygen including carboxylic and sulfonic acid groups, with the former preferred because of the availability of the intermediates and the ease with which such groups are introduced into the cellulose molecule.

The addition polymerizable component may comprise one, two or more such compounds, preferably those containing a plurality of addition polymerizable ethylenic linkages. This component must be present in concentrations ranging from about 10 to about 60% by weight of the total composition and preferably ranging from about 20 to about 40% by weight of the whole composition.

Not only is the amount of this component important, but so is its chemical and physical nature. Since the photopolymerizable compositions should be substantially transparent to the actinic light, although slight haze can be tolerated, the low molecular weight polymerizable components must be compatible with and preferably show some plasticizing action for the cellulose derivative containing the lateral free acid groups. Generally speaking, a layer of the composition, including the necessary added photoinitiator, must have an optical density to the actinic light of less than 0.5 per mil and less than 5.0 at wavelengths above 3000 A.

The low molecular weight, addition polymerizable component must also have a boiling point above 100° C. at atmospheric pressure. It can vary in molecular weight from about 100 to about 1500 but should contain at least one addition polymerizable ethylenic linkage for every 300 units of molecular weight. The preferred low molecular weight addition polymerizable components are those of molecular weight 150 to 500 containing at least one addition polymerizable ethylenic linkage for every 100 to 250 units of molecular weight.

The photoinitiator, i.e., addition polymerization initiator activatable by actinic light is, of course, an important component of the composition. Many such compounds are known and they can be used singly or two or more can be admixed in the composition. They should be soluble in the composition or be capable of substantially uniform distribution therethrough. The photoinitiators are generally used in the compositions in amounts ranging from about 0.01% up to about 5.0% with preferred quantities lying in the range of 0.1 to 2.0%, based on the polymerizable component.

Figure 2:
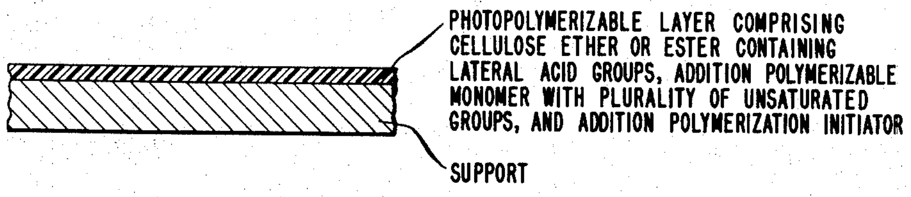
Figure 3:
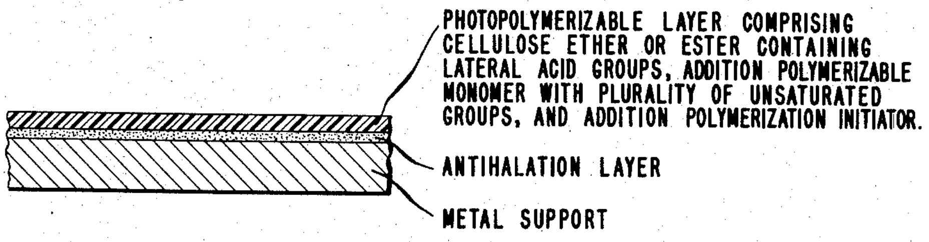
Figure 4:
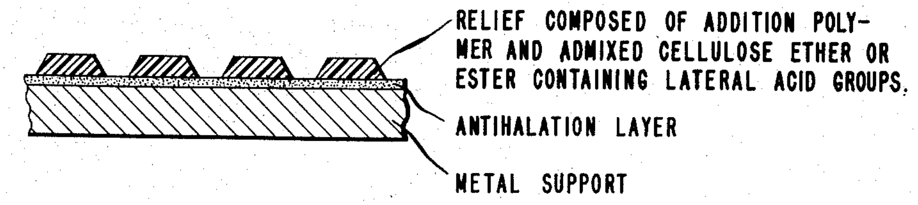

In the attached drawing which constitutes a part of this application:

Fig. 1 is a triangular graph of the interrelated variables of the cellulose ethers and esters containing acid groups, Fig. 2 is a cross-sectional view of one type of photopolymerizable element of the invention, Fig. 3 is a cross-sectional view of an alternative element, and Fig. 4 is a cross-sectional view of a portion of a printing relief.

This invention is further illustrated by, but is not limited to, the following examples in which the parts and percentages are by weight. These examples illustrate some preferred compositions and their use in photopolymerizable elements in the preparation of printing plates. These examples also illustrate the importance of the above limits.

In these examples, as elsewhere in this application, the numerical values for the various groups per glucose unit are believed to be accurate to ±0.05. In the interest of brevity the following abbreviations have been used:

T.D.S=total degree of substitution, i.e., total number of substituents per glucose unit
A.D.S.=acid degree of substitution, i.e., number of substituents with free acid groups per glucose unit
N.D.S.=neutral degree of substitution, i.e., number of neutral substituents per glucose unit
H.G.U.=number of hydroxyl groups per glucose unit
G–OH=glucose hydroxyls (i.e., only directly linked to backbone)
N.E.=neutral equivalent
CA=cellulose acetate
CP=cellulose propionate
EC=ethyl cellulose
BME=benzoin methyl ether
SA=succinic anhydride
MA=maleic anhydride
PA=phthalic anhydride
GA—glutaric anhydride
HS=hydrogen succinate
HM=hydrogen maleate
HP=hydrogen phthalate
HG=hydrogen glutarate
Carbic anhydride=bicyclo(2,2,1)hept-5-ene-2,3-dicarboxylic acid anhydride
H carbate=hydrogen bicyclo(2,2,1)hept-5-ene-2,3-dicarboxylate
$\Delta^4$PA=$\Delta^4$-tetrahydrophthalic acid anhydride
H$\Delta^4$P=hydrogen$\Delta^4$-tetrahydrophthalate
3-MCBA=3-methylenecyclobutane-1,2-dicarboxylic acid anhydride
H3-MCB=hydrogen 3-methylenecyclobutane-1,2-dicarboxylate
ASA=allylsuccinic acid anhydride
HAS=hydrogen allylsuccinate
TEGDMA=triethyl glycol dimethacrylate
TMGDMA=tetramethylene glycol dimethacrylate
BMAPE=1,2-bis($\alpha$-methacrylamidopropoxy)ethane
TEGDA=triethylene glycol diacrylate
DEGDMA=diethylene glycol dimethacrylate

EXAMPLE I

A solution of five parts of a commercially available cellulose acetate/hydrogen phthalate (T.D.S.=2.50;

A.D.S.=0.90; N.D.S.=1.60; H.G.U.=1.40; N.E.=402), about 1.7 parts of triethylene glycol dimethacrylate containing 49 parts per million of hydroquinone, and 0.08 part of benzoin methyl ether in a mixture of methyl alcohol, methylene chloride and dioxane was cast about 40 mils thick on a glass plate and the solvents allowed to evaporate at room temperature in the dark over a period of about 72 hours. A line process negative carrying a letter text in clear areas on a dark background was placed on the upper surface of the resulting firm, slightly hazy about 15-mil film. The resulting assembly, including the initial glass plate, was placed on a black antihalation background on a turntable rotating at about 4 r.p.m. and exposed for about 15 minutes to the light from four 275-watt RS type mercury vapor sunlamps suitably arranged at a distance of 12 to 14 inches. After removal of the negative the unexposed and thus unchanged cellulose acetate/hydrogen phthalate, triethylene glycol dimethacrylate, benzoin methyl ether, hydroquinone composition, i.e., that portion of the photopolymerizable film under the dark areas in the negative, was removed by washing with dilute (about 1%) aqueous sodium bicarbonate for about ten minutes at room temperature. There was thus obtained a mechanically strong, printable, raised relief image of the letter text in the clear areas of the negative with good fidelity.

Similar results were obtained under substantially identical conditions with the same cellulose acetate/hydrogen phthalate and varying amounts of low molecular weight polymerizable components as outlined in Table I below. The films were cast about 30 mils thick (dry, about 10 mils) from an about 50/50 by volume dioxane/ethyl alcohol mixture. Exposure was to one 275-watt mercury vapor sunlamp at a distance of eight inches from the films, using no turntable. Development was in dilute (about 1%) aqueous $NH_4OH$.

*Table I*

| Parts CA/HP | Parts BME | Parts | Polymerizable | Comments |
|---|---|---|---|---|
| 5.0 | 0.10 | 3.3 | Triethylene glycol dimethacrylate | Strong, printable image with good fidelity. |
| 6.0 | 0.10 | 4.0 | Diallyl phthalate | No stabilizer, printable relief. |
| 5.0 | 0.10 | 4.0 | Ethylene glycol dimethacrylate | Slightly hazy, resulting in a slightly rounded printable relief. |
| 3.0 | 0.05 | 1.0 | Ethylene glycol diacrylate | Do. |
| 3.0 | 0.05 | 1.0 | Hydroxyethyl methacrylate | Slight rounding of image during development believed due to slight solubility of the methacrylate polymer but printable relief. |

EXAMPLE II

PART A.—PREPARATION OF A CELLULOSE ACETATE/HYDROGEN MALEATE POLYMER

In the general manner of U.S. 2,069,974, a mixture of 50 parts of a partially hydrolyzed cellulose acetate (43.7% combined acetic acid, D.S.=1.70), 50 parts of maleic anhydride, and 10 parts of potassium acetate in 258 parts of dioxane was heated with stirring at 95° C. for about 18 hours. The reaction mixture was then poured with stirring into an excess of water and the resultant white solid product removed by filtration, washed with water, and dried. There was thus obtained 31 parts of a white, water-insoluble, aqueous base-soluble cellulose acetate/hydrogen maleate polymer (T.D.S.=2.23; A.D.S.=0.53; N.D.S.=1.70; H.G.U.=1.30; N.E.=534).

PART B.—PREPARATION OF A CELLULOSE ACETATE/HYDROGEN MALEATE BASED PRINTING RELIEF

A solution of 5 parts of the above cellulose acetate/hydrogen maleate polymer, 3 parts of triethylene glycol dimethacrylate (containing 0.1% hydroquinone), and 0.1 part of benzoin methyl ether in about 10 parts of a 90/10 acetone/water blend was cast on a glass plate and the solvents allowed to evaporate at room temperature in the dark. The resultant firm, dry, slightly hazy, about 20-mil film was exposed through a line process negative and developed as in Example I. There was thus obtained a clear, sharp, hard, printable, raised relief image of the clear letter text of the negative in good fidelity.

In the same manner as described in Example II, Part A, other cellulose/hydrogen carboxylate polymers were prepared as outlined in the following Table II. In those instances where pyridine was the solvent, precipitation was effected in excess dilute aqueous hydrochloric acid. The cellulose ether/hydrogen dicarboxylates were prepared in accordance with the general procedures of U.S.

*Table II*

| Item | Parts | Starting Polymer | D.S. | Parts | Dibasic Acid Reactant | Product | T.D.S. | A.D.S. | N.D.S. | H.G.U. | N.E. |
|---|---|---|---|---|---|---|---|---|---|---|---|
| 1 | 40 | EC* | 1.80 | 75 | PA | EC/HP | 2.90 | 1.10 | 1.80 | 1.20 | 336 |
| 2 | 40 | CA | 1.75 | 50 | SA | CA/HS | 2.88 | 1.13 | 1.75 | 1.25 | 306 |
| 3 | 20 | EC* | 1.85 | 36 | PA | EC/HP | 2.75 | 0.90 | 1.85 | 1.15 | 390 |
| 4 | 20 | CA* | 1.70 | 25 | Carbic anhydride | CA/H carbate | 2.40 | 0.70 | 1.70 | 1.30 | 500 |
| 5 | 40 | CA | 1.95 | 75 | PA | CA/HP | 3.00 | 1.05 | 1.95 | 1.05 | 381 |
| 6 | 40 | CA | 1.63 | 50 | SA | CA/HS | 2.83 | 1.20 | 1.63 | 1.37 | 292 |
| 7 | 40 | CA | 1.95 | 35 | PA | CA/HP | 2.55 | 0.60 | 1.95 | 1.05 | 552 |
| 8 | 40 | CA | 1.62 | 35 | PA | CA/HP | 2.20 | 0.58 | 1.62 | 1.38 | 544 |
| 9 | 40 | CA | 1.93 | 50 | MA | CA/HM | 2.67 | 0.74 | 1.93 | 1.07 | 440 |
| 10 | 40 | CA | 1.93 | 75 | $\Delta^4$PA | CA/H$\Delta^4$P | 3.00 | 1.07 | 1.93 | 1.07 | 373 |
| 11 | 80 | CA | 1.62 | 75 | PA | CA/HP | 2.13 | 0.51 | 1.62 | 1.38 | 597 |
| 12 | 40 | CA | 1.93 | 60 | GA | CA/HG | 3.00 | 1.07 | 1.93 | 1.07 | 342 |
| 13 | 40 | CA | 1.62 | 60 | GA | CA/HG | 2.76 | 1.14 | 1.62 | 1.38 | 318 |
| 14 | 20 | CA | 1.93 | 30 | 3-MCBA | CA/H3-MCB | 2.90 | 0.97 | 1.93 | 1.07 | 386 |
| 15 | 40 | CA | 0.85 | 50 | SA | CA/HS | 2.35 | 1.50 | 0.85 | 2.15 | 230 |
| 16 | 20 | CA | 1.93 | 30 | ASA | CA/HAS | 3.00 | 1.07 | 1.93 | 1.07 | 336 |
| 17 | 80 | CA | 1.63 | 50 | SA | CA/HS | 2.18 | 0.55 | 1.63 | 1.37 | 518 |
| 18 | 80 | CA | 1.93 | 50 | SA | CA/HS | 2.73 | 0.80 | 1.93 | 1.07 | 402 |
| 19 | 80 | CA | 1.93 | 70 | PA | CA/HP | 2.56 | 0.63 | 1.93 | 1.07 | 531 |
| 20 | 4180 | CA | 1.88 | 4180 | SA | CA/HS | 3.00 | 1.12 | 1.88 | 1.12 | 318 |
| 21 | 40 | CA | 2.06 | 40 | SA | CA/HS | 2.81 | 0.75 | 2.06 | 0.94 | 434 |
| 22 | 20 | CA | 1.93 | 30 | 4-Carboxyphthalic anhydride. | CA/Dihydrogen trimellitate. | 2.48 | 0.55 | 1.93 | 1.07 | 314 |
| 23 | 10 | CA | 1.92 | 15 | GA | CA/HG | 2.71 | 0.79 | 1.92 | 1.08 | 420 |
| 24 | 20 | CA | 1.70 | 30 | GA | CA/HG | 2.67 | 0.97 | 1.70 | 1.30 | 354 |
| 25 | 3600 | CA | 1.93 | 3600 | SA | CA/HS | 2.77 | 0.84 | 1.93 | 1.07 | 388 |
| 26 | 20 | CP | 1.68 | 40 | SA | CP/HS | 2.58 | 0.90 | 1.68 | 1.32 | 359 |
| 27 | 40 | CA | 2.35 | 40 | SA | CA/HS | 2.90 | 0.55 | 2.35 | 0.65 | 497 |
| 28 | 40 | CA | 2.10 | 40 | SA | CA/HS | 2.90 | 0.80 | 2.10 | 0.90 | 423 |

*Pyridine used for the reaction medium.

Patents 2,069,974 and 2,093,462. The amount of the reaction medium varied with the quantity of the reactants. All reactions were carried out at about 95° C. for about 18 hours.

In the same manner as described in Example II, Part B, other acidic cellulose derivative, low molecular weight addition polymerizable component, photoinitiator compositions were prepared, films cast therefrom, exposed and developed as outlined in the following Table III. The solvent used in the casting solutions was acetone containing about 10% water, i.e., a 90/10 acetone/water blend. The particular solvent used is not critical since it merely provides a method of obtaining films of the compositions. The amount of the acidic cellulose component in these casting solutions varied from 15–30% based on the solvent alone, i.e., not considering the low molecular weight addition polymerizable component. These ranges gave convenient viscosities for processing of the films. Larger amounts can be used and, in fact, with milling or calendering equipment a solvent is unnecessary. The thickness of the photopolymerizable layer on the support varied from about 10–20 mils. Unless otherwise noted in Table III, the compositions contained 0.05 part of benzoin methyl ether and about 0.1% hydroquinone based on the low molecular weight polymerizable component.

*Table III*

| Item | Parts | Polymer | Item in Table II | Parts | Polymerizable | Comments |
|---|---|---|---|---|---|---|
| 1 | 10.0 | EC/HP | 1 | 6.0 | TEGDMA | 0.2 Part BME; image was clear, fairly sharp, hard, and printable. |
| 2 | 10.0 | EC/HP | 1 | 7.0 | TEGDMA | 0.1 Part BME; image was clear, fairly sharp, hard and printable. |
| 3 | 5.0 | CA/HS | 2 | 3.0 | TEGDMA | 0.1 Part BME; used about 1% aqueous $Na_2CO_3$ solution to develop; image same as item 1. |
| 4 | 5.0 | CA/HS | 2 | 3.0 | TMGDMA | 0.1 Part BME; films translucent before exposure; image same as item 1. |
| 5 | 5.0 | CA/HS | 2 | 3.0 | BMAPE | 0.1 Part BME; faster development; image same as item 1. |
| 6 | 5.0 | EC/HP | 3 | 3.5 | TEGDMA | 0.1 Part BME; image was clear but sharper and with excellent fidelity. |
| 7 | 5.0 | EC/HP | 3 | 3.0 | TEGDMA | 0.1 Part BME; slightly hazy films; image same as item 1. |
| 8 | 5.0 | EC/HP | 3 | 3.0 | TMGDMA | 0.1 Part BME; slower development; image same as item 1. |
| 9 | 5.0 | EC/HP | 3 | 3.0 | BMAPE | 0.1 Part BME; films clearer; development faster; image same as item 1. |
| 10 | 5.0 | CA/H carbate | 4 | 3.0 | TEGDMA | 1.6% BME; both 1% aqueous $NH_4OH$ and $Na_2CO_3$ used in development; both effective; films clear, images sharp, hard, clear, and printable. |
| 11 | 5.0 | do | 4 | 3.0 | TEGDA | |
| 12 | 5.0 | CA/HP | 5 | 3.0 | TEGDMA | 1.6% BME; developed in 1% aqueous $NH_4OH$; images very sharp with excellent fidelity and easily printable. |
| 13 | 5.0 | CA/HP | 5 | 3.0 | TEGDA | 1.6% BME; developed in 1% aqueous $NH_4OH$; image sharp with excellent fidelity and easily printable. |
| 14 | 5.0 | CA/HS | 6 | 3.0 | TEGDMA | Developed in aqueous 1% $Na_2CO_3$; clear, firm films; clear, sharp, hard images with excellent fidelity and reproduction of detail; easily printable. |
| 15 | 5.0 | CA/HS | 6 | 3.0 | TEGDA | Do. |
| 16 | 5.0 | CA/HS | 6 | 3.0 | BMAPE | Films slightly hazy; images clear and same as item 12. |
| 17 | 5.0 | CA/HP | 7 | 3.0 | TEGDMA | Films clear, dry, and firm; images were hard, tough, clear, and easily printable. Development in aqueous 1% $NH_4OH$ was slower than in items 14–16. |
| 18 | 5.0 | CA/HP | 7 | 3.0 | TEGDA | |
| 19 | 5.0 | CA/HP | 7 | 3.0 | BMAPE | |
| 20 | 5.0 | CA/HP | 8 | 3.0 | TEGDMA | Films, images, and development same as items 17–19. |
| 21 | 5.0 | CA/HP | 8 | 3.0 | TEGDA | Do. |
| 22 | 5.0 | CA/HP | 8 | 3.0 | BMAPE | Do. |
| 23 | 5.0 | CA/HM | 9 | 3.0 | TEGDMA | Films slightly hazy; images same as items 17–19; development good, about same as items 17–19. |
| 24 | 5.0 | CA/H$\Delta^4$P | 10 | 3.0 | TEGDMA | Films clear, slightly soft, but not tacky; development slower than items 17–19; images hard and fairly sharp. |
| 25 | 5.0 | CA/HP | 11 | 3.0 | TEGDMA | Films clear, hard, and dry; development in aqueous 1% $NH_4OH$; images hard, clear, sharp, easily printable with excellent fidelity. |
| 26 | 5.0 | CA/HP | 11 | 3.0 | TEGDA | Do. |
| 27 | 5.0 | CA/HP | 11 | 3.0 | BMAPE | Do. |
| 28 | 5.0 | CA/HG | 12 | 3.0 | TEGDMA | Films clear and dry; development and images same as item 25. |
| 29 | 5.0 | CA/HG | 12 | 3.0 | TEGDA | Do. |
| 30 | 5.0 | CA/HG | 13 | 3.0 | TEGDMA | Same as item 25. |
| 31 | 5.0 | CA/HG | 13 | 3.0 | TEGDA | Do. |
| 32 | 5.0 | CA/H3-MCB | 14 | 3.0 | TEGDMA | Films dry and clear; development and images same as item 25. |
| 33 | 5.0 | CA/H3-MCB | 14 | 1.0 | TEGDA | Do. |
| 34 | 5.0 | CA/H3-MCB | 14 | 0.0 | None | Films dry and clear; no image resulted, proving need of low molecular weight polymerizable, even with unsaturated cellulose derivative. |
| 35 | 5.0 | CA/HS | 15 | 3.0 | TEGDA | Films clear, firm, and hard; development and images same as item 25 of this Table; slight blushing in development. |
| 36 | 5.0 | CA/HAS | 16 | 3.0 | TEGDMA | Films clear, flexible, and relatively soft; development as in item 25; images hard, sharp and printable. |
| 37 | 5.0 | CA/HAS | 16 | 3.0 | TEGDA | Do. |
| 38 | 3.5 | CA/HS | 17 | 0.9 | TEGDMA | Clear, dry films; development and images same as in item 25, very slight etching in development. |
| 39 | 3.5 | CA/HS | 17 | 1.50 | TEGDMA | Clear, dry films; development and images same as in item 38; no attack, images sharp, hard and detailed. |
| 40 | 3.5 | CA/HS | 17 | 2.33 | TEGDMA | Same as in item 38, slight exudation; development and images same as in item 38; no attack, images sharp, hard and detailed. |
| 41 | 3.5 | CA/HS | 17 | 3.5 | TEGDMA | Clear film but exudation of polymerizable; development same, no attack, images sharp, hard and detailed. |
| 42 | 3.5 | CA/HS | 18 | 1.5 | TEGDMA | Clear, dry, firm films; development as above; clear, hard, sharp, printable reliefs which gave sharp, excellent prints. |
| 43 | 3.5 | CA/HS | 18 | 2.33 | TEGDMA | Do. |
| 44 | 3.5 | CA/HS | 18 | 3.5 | TEGDMA | Slightly hazy film, some exudation; development and reliefs same as item 42 but slightly opalescent. |
| 45 | 3.5 | CA/HP | 19 | 1.5 | TEGDMA | Same as item 42. All were manually printed to give excellent, clear, sharp, faithful copies of the letter text on the process negative. |
| 46 | 3.5 | CA/HP | 19 | 2.33 | TEGDMA | Same as item 43. |
| 47 | 3.5 | CA/HP | 19 | 3.5 | TEGDMA | Same as item 44. |
| 48 | 6.0 | CA/HS | 20 | 3.0 | TEGDMA | Films clear, hard, and dry; good development in aqueous $NH_4OH$; images good, hard, clear, sharp and printable. |
| 49 | 6.0 | CA/HS | 20 | 3.0 | TEGDA | |
| 50 | 6.0 | CA/HS | 20 | 3.0 | DEGDMA | Do. |
| 51 | 6.0 | CA/HS | 21 | 3.0 | DEGDMA | Films clear and dry; development as before but slower; images hard, tough, printable, fairly sharp. |
| 52 | 6.0 | CA/Dihydrogen trimellitate. | 22 | 3.0 | DEGDMA | Films clear and dry; development as before but rapid; images hard, tough, printable and sharp. |
| 53 | 5.0 | CA/HG | 23 | 2.5 | DEGDMA | Films as in item 52, but flexible; development same but very slow; images same but fairly sharp. |
| 54 | 5.0 | CA/HG | 24 | 2.5 | TEGDA | Films same as item 53; development same but good; images same but sharp. |
| 55 | 5.0 | CA/HG | 24 | 2.5 | DEGDMA | Same as item 54, but image not quite so good. |
| 56 | 6.0 | CA/HS | 25 | 3.0 | TEGDA | 0.05 Part benzoin; films clear, dry and hard; development same as item 53 and fast; images hard, sharp, clear and printable. |
| 57 | 6.0 | CA/HS | 25 | 3.0 | TEGDMA | 0.01 Part of commercial 2-tert.-butyl-4-methylphenol as inhibitor; films, development, and images the same as item 56. |
| 58 | 6.0 | CP/HS | 26 | 3.0 | TEGDMA | 0.005 Part of hydroquinone as inhibitor; films clear, dry, and fairly soft; development and images the same as item 56; but undesirably slow. |
| 59 | 6.0 | CP/HS | 26 | 3.0 | TEGDA | Do. |
| 60 | 6.0 | CA/HS | 27 | 3.0 | TEGDA | 0.025 part of BME and about 0.16% hydroquinone stabilizer; development in aqueous 6% of 28% $NH_4OH$, 20% ethanol. Good printable image. Slow development; Faster development in 30% ethanol or acetone. |
| 61 | 6.0 | CA/HS | 28 | 3.0 | TEGDA | Same as item 60. Developed well to good printable image in aqueous 6% of 28% $NH_4OH$ and 10% ethanol. |

EXAMPLE III

Commercial cellulose acetate/butyrate (butyryl D.S.=0.70; acetyl D.S.=2.20) was hydrolyzed in dioxane/water solution with added dilute ammonium hydroxide solution for about 72 hours at room temperature. The reaction mixture was then poured into an excess of water with stirring, and the white solid polymer isolated by filtration, washed with water, and dried. The resultant hydrolyzed cellulose acetate/butyrate containing an increased number of free hydroxyl groups was soluble in alcohols and in pyridine but insoluble in acetone and in dioxane in contrast to the starting (more highly substituted) polymer. A solution of 10 parts of this hydrolyzed cellulose acetate/butyrate, and 15 parts of succinic anhydride in 200 parts of pyridine was heated with stirring for 18 hours at 95° C. The reaction mixture was then poured with stirring into an excess of water and the white solid polymer product isolated by filtration, washed with water, and dried. There was thus obtained a cellulose acetate/butyrate/hydrogen succinate as a white, fluffy product, soluble in acetone and in dilute aqueous $NH_4OH$, and exhibiting a neutral equivalent of 218. A solution of 6.0 parts of this cellulose acetate/butyrate/hydrogen succinate, 3.0 parts of triethylene glycol diacrylate, 0.05 part of benzoin methyl ether and 0.01 part of hydroquinone in about 15 parts of a 90/10 acetone/water blend was cast on a glass plate about 30 mils thick and the solvent allowed to evaporate at room temperature in the dark. The resultant clear, dry, fairly soft films were exposed to light through a line process negative and developed with dilute aqueous $NH_4OH$ as described in Example I. The resultant images were clear, hard, fairly sharp and printable with good fidelity.

EXAMPLE IV

Three hundred (300) grams of cellulose acetate/hydrogen succinate (T.D.S.=2.70; A.D.S.=0.43; N.D.S.=2.27; H.G.U.=0.73; N.E.=400) was mixed with 150 g. of triethylene glycol diacrylate containing 1.5 g. of benzoin and 0.25 g. 2,6-di-tertiary-butyl p-cresol. This mixture was formed into translucent sheets by milling on a 2-roll rubber mill at 110° C. for 10 minutes to form a composition which had a viscosity in the range of 400 to 5500 poises at 150° C. The resulting sheets were formed into clear transparent sheets by pressing at 150° C. under a pressure of 300 lb./sq. in. A portion of the pressed sheet was bonded to a piece of aluminum 100 mils thick by means of "Scotchweld" Bonding Film No. 583, an adhesive composition made by the Minnesota Mining and Manufacturing Co., and consisting of a butadiene/acrylonitrile copolymer combined with a phenol/formaldehyde resin, said adhesive being thermoplastic but having slight thermosetting properties also. This adhesive, a yellowish-brown material, also served as an antihalation layer. Its light transmission is 0 at wavelengths less than 440 mμ and, at wavelengths from 450 to 550 mμ, is in accordance with the following table:

| λ(mμ) | Percent transmission |
|---|---|
| 450 | 0.1 |
| 460 | 0.1 |
| 470 | 1.3 |
| 480 | 3.0 |
| 490 | 6.1 |
| 500 | 9.0 |
| 510 | 12.1 |
| 530 | 17.8 |
| 550 | 23.1 |

It constitutes an adequate absorbing layer under the conditions of exposure given below. A sandwich consisting of a layer of "Scotchweld" No. 583 between the polymer and aluminum was compressed lightly in a laminating press for 30 seconds at 120° C. The resultant plate, consisting of a clear, approximately 40-mil layer of cellulose acetate/hydrogen succinate, triethylene glycol diacrylate, benzoin and 2,6-ditertiary-butyl p-cresol, was placed in a vacuum frame, and the polymer surface was brought into contact with a line process negative. The vacuum frame containing the plate and negative was placed beneath a 2000-watt high-pressure mercury arc, and the plate was exposed for 8 minutes. After exposure, the negative was stripped from the plate, and the unexposed polymer was removed by brushing for 10 minutes in a 1.5% aqueous solution of ethanolamine. A relief image firmly bonded to the aluminum and corresponding to the clear areas of the negative was obtained. The plate was mounted on the bed of a flat bed printing press and was used to print 80,000 satisfactory impressions on 60 lb., 1-side coated label paper. Plates prepared by removing unexposed polymer by means of 0.03% aqueous $NH_4OH$ and 1% $Na_2CO_3$ gave similar results.

With respect to the foregoing examples, representative optical densities are as follows:

| Composition (Item) of Table III | Maximum Optical Density at 3,000 A. and above as calculated for a 10-mil Film |
|---|---|
| 18 | 2.40 |
| 20 | 2.30 |
| 21 | 1.85 |
| 32 | 1.10 |
| 37 | 0.80 |
| 49 | 2.70 |
| 56 | 1.75 |

From the foregoing it is apparent that the acidic cellulose derivative is an important component of the photopolymerizable compositions and elements. They are hard film-forming solids and have a total degree of substitution from 2.00–3.00 and preferably from 2.50–3.00 This range is critical. Photosensitive compositions, otherwise identical to those of the present invention but based on acidic cellulose derivatives having a total degree of substitution below 2.00, are unsatisfactory because even though enveloped in the addition polymer they swell undesirably during development thereby resulting in distortion of the relief image with resultant unsharpness, blurring, loss of detail, poor fidelity, etc. in prints made therefrom. The dimensions of a printing relief must be substantially identical with the original to assure high fidelity of duplication by printing.

Another important factor in the characterization of the acid cellulose derivatives is the total number of hydroxyl groups present (including hydroxyl groups per se on the cellulose backbone and hydroxyl groups present in terminal oxyacid substituents, such as the hydroxyl of carboxyl or sulfo substituents) which must lie in the range 0.50–2.50 and preferably 1.00–1.75. This factor is well supported by the examples which clearly show trends toward greater moisture absorption as the total number of hydroxyl groups increases and toward less easy development in aqueous systems as the number of said hydroxyl groups decreases. While a certain degree of moisture sensitivity is permissible this should not be excessive since problems of dimensional stability might arise in use under varying atmospheric conditions.

While the critical nature of the limits (*a*) of total degree of substitution is important to avoid image distortion resulting from swelling during development and (*b*) of total number of hydroxyl groups is important to avoid high moisture sensitivity resulting in unsatisfactory dimensional stability, both these factors are interdependent and variations in either affect both development characteristics and moisture sensitivity. From the economic standpoint, it is desirable that the total degree of substitution be high. This is especially true for the cellulose esters which are most conveniently obtained as the full cellulose triester and post-hydrolyzed to the degree of ester substitution desired.

Another important factor in the acidic cellulose component is the neutral equivalent thereof, a measure of the amount of titratable free acid groups in the molecule, which must lie within the range 200 to 700. This range is exemplified in the working examples which clearly show that development in aqueous bases becomes slower as the neutral equivalent increases toward the upper part of this range and the examples also show that water-sensitivity increases as the neutral equivalent approaches the lower end of this range. Furthermore, with the cellulose derivatives having too low a neutral equivalent, problems of compatibility arise with the preferred addition polymerizable low molecular weight components, e.g., the polyol esters of $\alpha$-methylene carboxylic acids, and the corresponding amides of the corresponding polyamines or oxyamines.

This range of neutral equivalent can also be described in terms of the acid degree of substitution, i.e., the number of lateral free acid-containing substituents per glucose unit. Thus, the acid degree of substitution should lie in the range 0.50 to 1.50 and preferably from 0.50 to 1.25.

From the above ranges of limits on the total degree of substitution, hydroxyl groups per glucose unit, and acid degree of substitution two other critical ranges for the acidic cellulose component can be determined. Thus, since the hydroxyl groups per glucose unit cannot exceed 2.50 and since this represents the sum of the acid degree of substitution, and the hydroxyls pendent directly on the cellulose chain (i.e., the glucose hydroxyls or G–OH), there must be present neutral, preferably hydrocarbon ether or ester, groups with the required range of neutral degree of substitution lying between 0.50 and 2.50, and preferably from 1.25 to 2.00. Similarly, since the sum of the total degree of substitution and the glucose hydroxyls must equal 3.00 and the required range of total degree of substitution lies between 2.00 and 3.00, and preferably between 2.50 and 3.00, the permitted ranges for glucose hydroxyls lies between 0.00 and 1.00, and preferably between 0.00 and 0.50. These ranges and calculations can be expressed more simply by the following equations:

A.D.S.+N.D.S.+G–OH=3.0
A.D.S.+G–OH=H.G.U.
∴H.G.U.+N.D.S.=3.00
H.G.U.=0.50 to 2.50 and preferably 1.00 to 1.75
∴N.D.S.=3.00–0.50 to 3.00–2.50=0.50 to 2.50, and preferably 3.00–1.00 to 3.00–1.75=1.25 to 2.00.

Similarly,

T.D.S.+G–OH=3.00
T.D.S.=2.00 to 3.00, and preferably 2.50 to 3.00
G–OH=3.00–2.00 to 3.00–3.00=0.00 to 1.00, and prefer-
G–OH=3.00–2.50 to 3.00–3.00=0.00 to 0.50.

Acidic cellulose derivatives having neutral substituents in amounts outside this range lack utility in compositions like those of the present invention. Thus, cellulose derivatives containing less than the specified amount of neutral substituents contain so many hydroxyl groups per glucose unit as to be less compatible with the preferred less water-sensitive ester-type polymerizable components and to require generally a polar more water-sensitive polymerizable component. Likewise, compositions containing neutral substituents in amount greater than 2.50 per glucose unit have such a preponderance of the molecule in non-acidic or water-insensitive substituents or groups as to be so aqueous base-insensitive as to be undevelopable, i.e., the unexposed areas cannot be washed away with an aqueous base.

From the above, since the sum of A.D.S, G–OH, and N.D.S. must equal 3.00, the situation exists where there are three variables, the sum of which is a constant, and accordingly graphic expression of these interrelated variables can be achieved in a triangular graph. Figure 1 of the attached drawing presents these data. Each of the axes runs in units from 0.00 to 3.00; one axis shows increasing neutral degree of substitution, the second increasing glucose hydroxyls, and the third increasing acid degree of substitution. On plotting these three variables within the aforesaid ranges it becomes apparent that the operable acidic cellulose derivatives are most precisely defined and are represented in Figure 1 by the small enclosed figure ABCD, and the preferred compositions by the much smaller area encompassed by the figure EFGH.

While the above ranges for the amounts of the various possible substituents in the useful acidic cellulose derivatives are relatively narrow, it is apparent that variations in the specific substituents involved will require suitable variations in the relative amounts thereof. An important variation called for within these ranges has to do with the carbon content, and particularly with the carbon chain lengths of each substituent. Thus, as the neutral, preferably hydrocarbon ether or ester, substituents increase in chain length, the amount permitted consistent with aqueous base development will decrease. For instance, in going from a cellulose acetate derivative to a cellulose propionate derivative the maximum neutral degree of substitution should not exceed 1.50 while the ranges of total degree of substitution and acid degree of substitution will be the same, thereby resulting in an increase in the respective minimum number of glucose hydroxyls and hydroxyl groups per glucose unit over those for the acetate composition but still within the limits for these factors. Similarly, in going from a cellulose propionate to a cellulose butyrate deravtive, the maximum neutral degree of substitution drops still further and cannot exceed 1.00 with the total degree of substitution and the acid degree of substitution remaining constant, thereby resulting in a further increase in the minimum hydroxyl groups per glucose unit and the glucose hydroxyls over the acetate and propionate compositions but still within the limits for these factors.

Likewise, with increasing chain lengths of the acid substituents, i.e., with increasing chain between the terminal acid, generally carboxylic or sulfonic, group and the cellulose main chain, suitable alteration of the permitted ranges of neutral degree of substitution will also have to be considered in order to maintain again the necessary aqueous base solubility of the acidic cellulose derivatives. It will be apparent from the above that the longer chain length substituents generally require a simple increase in the number of hydroxyl groups, either in the acidic substituents or pendent directly on the cellulose chain. With increasing chain length in the acidic substituents increased solubility can be compensated for by an increase in the number of glucose hydroxyls and therefore by a decrease in the neutral degree of substitution. The variations called for by increasing chain length in the acidic substituents are not reflected by as rapid a change in the permitted range of neutral degree of substitution as in the case of increasing chain length with neutral substituents. However, such an increase must be given.

With increasing chain length in both substituent types, i.e., neutral and acidic, it is apparent from the foregoing that even more rapid changes in the number of glucose hydroxyls are called for. Thus, for instance, in going from a cellulose acetate/hydrogen succinate to a cellulose butyrate/hydrogen carbate composition, the permissive range of neutral substitution will drop to 0.50 to 1.00 with the acid degree of substitution and the total degree of substitution remaining constant thereby resulting in an increase in the hydroxyl groups per glucose unit to 2.00 to 2.50.

These various interrelated factors are known in the cellulose art and can best be described by stating that increased chain length in the various types of substituents calls for increases in the minimum values of the complementary substituents or glucose hydroxyls, and similarly that decreases in chain length of the various substituents calls for increases in the amounts of the various complementary substituents with decreases in the number of hydroxyl groups per glucose unit. It is to be understood that these interrelated factors and variations therein are concerned only with compositions of improved properties. The prescribed ranges are further illustrated in the plotted areas of Fig. 1 of the drawing.

As will also be apparent to those skilled in the cellulose art, changes in the molecular weight, or more conventionally the DP, of the acidic cellulose derivative will generally be reflected by changes in the various permitted ranges of substitution. For instance, as the acidic cellulose DP decreases the permitted range of neutral degree of substitution will increase and the permitted range of acid degree of substitution will decrease. That is to say, given a lower molecular weight cellulose derivative, greater hydro-carbon content can be tolerated in the neutral substituents but more acid substituents cannot be tolerated since the composition would thereby become too water-sensitive. The converse is likewise true, namely, that with increasing DP of the acidic cellulose derivative the permitted range for the neutral degree of substitution will decrease and for the acid degree of substitution will increase to assure adequate water-sensitivity and aqueous base-solubility for development.

Another factor to be considered is in the relative amounts of these various substituents within the ranges already defined. From the economic standpoint, it is desirable to have as high a total degree of substitution, as high a neutral degree of substitution, and as low an acid degree of substitution (and therefore as low a number of glucose hydroxyls and hydroxyls groups per glucose unit) as possible consonant with the ability of the composition to be developed by aqueous base, i.e., consonant with the necessary aqueous base-solubility of the unexposed and unpolymerized composition.

As illustrated by the examples, the nature of the free acid-containing cellulose derivatives can vary widely, providing it exhibits the above-defined critical values for total degree of substitution (T.D.S.), acid degree of substitution (A.D.S.), number of hydroxyl units per glucose unit (H.G.U.), neutral degree of substitution (N.D.S.), and glucose hydroxyls (G–OH). The most useful derivatives are the cellulose esters and ethers. Thus, generically the acidic cellulose derivative component of the new photopolymerizable compositions of this invention have a cellulose backbone or polymer chain carrying lateral ester or ether substituents in amount so that the total degree of substitution is 2.00 to 3.00, the acid degree of substitution is 0.50 to 1.50, with the further proviso that the total number of hydroxyl groups including the hydroxyl groups of oxyacid substituents be from 0.50 to 2.50 per glucose unit. More specifically these components will have alkyl, aryl, aralkyl, alkaryl, or cycloalkyl radicals with the required number of free acid, usually sulfo or carboxyl, groups and other than —OH otherwise generally solely hydrocarbon in nature, linked to the cellulose backbone through ether or ester links generally oxyether or carbonyloxyester links. Although the invention includes the use of acyl esters of cellulose broadly, such as the sulfates, sulfonates, carboxylates, and the like, the last are much preferred since they are more readily available at lower cost and in general exhibit superior solubility and handling characteristics.

As to the lateral free acid groups, the invention in this respect is generic to all acid functions having an acid hydroxyl. A preferred class of these free acid groups are the strong oxy-acids of elements of groups IV–A, V–A, and VI–A of the periodic table. Because of readier availability, the carboxylic, phosphoric, sulfonic, and sulfuric acid groups are the most practical with the first being preferred because of better solubility and processing characteristics. The chain of these lateral acidic substituents linked to the cellulose through the aforesaid ether or ester groups can be saturated or unsaturated, including the main carbon chain of both the lateral neutral substituents and those carrying the free acid functions. In those cases where the lateral substituents carry intra-chain carbon-carbon unsaturation, these linkages may also participate in light-initiated polymerization of the lower molecular weight ethylenically unsaturated addition polymerizable component. However, such substituents generally render the acid-containing cellulose derivative more difficult to handle and for that reason the preferred cellulose derivatives for use in the new photosensitive compositions of this invention are free of carbon-carbon unsaturation.

Suitable specific examples of these free acid-containing cellulose derivatives include: saturated alkyl cellulose esters with lateral carboxyl groups, e.g., cellulose proppionate/hydrogen sebacate (T.D.S.=2.0, A.D.S.=1.0, H.G.U.=2.0); unsaturated alkyl cellulose esters with lateral carboxyl groups, e.g., cellulose acetate/methacrylate/hydrogen succinate (T.D.S.=2.50, A.D.S.=0.80, H.G.U.=1.30, methacrylate D.S.=0.20); cellulose acetate / crotonate / hydrogen phthalate (T.D.S. = 2.60, A.D.S.=0.90, H.G.U.=1.30, and crotonate D.S.=0.40); aryl cellulose esters with lateral carboxyl groups, e.g., cellulose benzoate/hydrogen terephthalate (T.D.S.=2.10, A.D.S.=1.20, H.G.U.=2.10); cycloaliphatic cellulose esters with lateral carboxyl groups, e.g., cellulose cyclohexanecarboxylate / hydrogen oxalate (T.D.S. = 2.10, A.D.S.=1.00, H.G.U.=1.90); inorganic cellulose esters with lateral carboxyl groups, e.g., cellulose nitrate/hydrogen phthalate (T.D.S.=2.60, A.D.S.=0.80, H.G.U.=1.20); alkyl cellulose ethers with lateral carboxyl groups, e.g., methyl cellulose/hydrogen phthalate (T.D.S.=2.30, A.D.S.=0.70, H.G.U.=1.40); cycloaliphatic cellulose ethers with lateral carboxyl groups, e.g., cyclohexyl cellulose/hydrogen succinate (T.D.S.=2.10, A.D.S.=0.80, H.G.U.=1.70); substituted cellulose ethers with lateral carboxyl groups, e.g., cyanoethyl cellulose/hydrogen phthalate (T.D.S.=2.50, A.D.S.=0.80, H.G.U.=1.30); unsaturated cellulose ethers with lateral carboxyl groups, e.g., allyl cellulose/hydrogen succinate (T.D.S.=2.30, A.D.S.=0.80, H.G.U.=1.50); aralkyl cellulose ethers with lateral carboxyl groups, e.g., benzyl cellulose/hydrogen phthalate (T.D.S.=2.20, A.D.S.=1.00, H.G.U.=1.80); mixed cellulose esters and ethers and substituted esters and ethers with lateral carboxyl functions, e.g., O-ethyl cellulose acetate/hydrogen succinate (T.D.S.=2.80, A.D.S.=0.80, H.G.U.=1.00); O-cyanoethyl/cellulose stearate/hydrogen phthalate (T.D.S.=2.20, A.D.S.=1.00, H.G.U.=1.80); O-benzyl cellulose acetate/propionate/hydrogen succinate (T.D.S. = 2.30, A.D.S. = 1.00, H.G.U.=1.70); O-hydroxyethyl cellulose acetate/hydrogen succinate (T.D.S. = 2.50, A.D.S. = 0.70, H.G.U.=1.40); cellulose ethers and/or esters with a plurality of lateral acid substitutents, e.g., O-carboxymethyl cellulose acetate/hydrogen succinate (T.D.S.=2.50, A.D.S.=1.00, succinate D.S. 0.70, H.G.U.=150), cellulose butyrate/hydrogen succinate/hydrogen phthalate (T.D.S.=2.00, A.D.S.=1.00, H.G.U.=2.00), ethyl cellulose/hydrogen succinate/hydrogen maleate (T.D.S.=2.80, A.D.S.=1.00, H.G.U.—1.20), O-ethyl cellulose acetate/hydrogen succinate/hydrogen phthalate (T.D.S.=2.60, A.D.S.=0.90, H.G.U.=1.30); cellulose esters and/or ethers with lateral free acid substituents other than the carboxyl group, e.g., cellulose acetate/hydrogen sulfate/hydrogen phthalate (T.D.S.=2.65, A.D.S.=0.85, $HSO_4$ D.S.=0.05, H.G.U.=1.20), ethyl cellulose hydrogen o-sulfobenzoate (T.D.S.=2.20, A.D.S.=0.50, H.G.U.=1.30), cellulose acetate/hydrogen "p-toluenesulfonate," i.e., O-p-sulfobenzyl cellulose acetate (T.D.S.=2.60, A.D.S.=0.80, H.G.U.=1.20), O-ethyl cellulose acetate/hydrogen "ethanesulfonate," i.e., O-ethyl, O-$\beta$-sulfoethyl cellulose acetate (T.D.S.=2.40, A.D.S.=0.60, H.G.U.=1.20); cellulose ethers and/or esters with lateral carboxyl groups wherein either or both the neutral or acidic substituents contain intrachain heteroatoms such as nitrogen, oxygen or sulfur, e.g., cellulose acetate/hydrogen diglycollate (T.D.S.=2.50, A.D.S.=0.80, H.G.U.=1.30), cellulose acetate/hydrogen thiodiglycollate, and the like.

Because of their availability and generally greater utility, the preferred acidic cellulose components of the compositions of this invention are cellulose derivatives generally of DP of 100 to 300 with the aforesaid preferred ranges of T.D.S., A.D.S., N.D.S., H.G.U., wherein the neutral substituents are short chain saturated hydrocarbon ethers or esters of no more than about six chain carbons in the shortest chain linked to the ether or ester groups and preferably of no more than four such chain carbons and wherein the acidic substituents carry free carboxylic or sulfonic acid groups and contain no more than about three chain atoms in the shortest chain linking the acid group to the ether or ester groups and most preferably no more than about two such chain atoms per acid substituent, which are most preferably solely carbon. Outstanding in this preferred group are the acidic cellulose derivatives, as just defined, wherein the neutral substituents are all carboxyester substituents and the acidic groups are all carboxylic acid groups. In these above-defined groups in terms of numbers of chain carbons, an aliphatic carbon is counted as a single unit in a chain; whereas a ring structure in the chain is counted as about two chain carbons rather than the total of all the ring atoms. To illustrate specifically, a cellulose butyrate/hydrogen phthalate has neutral carboxyester substituents containing four chain carbons and acidic carboxylic acid substituents containing about two chain carbons. A ring confers far less chain length character to these substituents than is indicated by the total number of ring members. More specifically, a hydrogen succinate and a hydrogen phthalate, and a propionate and a benzoate are about equivalent carboxylic acid and neutral carboxylic acid ester substituents, respectively; whereas, a hydrogen succinate and a hydrogen adipate and a propionate and a caproate are not equivalent such substituents, with the latter ones of the latter two pair being much less desirable.

These various acid substituted cellulose derivatives are well known in the art and can conveniently be made by well-known etherification or esterification reactions on cellulose or the simple cellulose ethers or esters. See, for instance, U.S. Patents 1,682,382, 2,069,974, and 2,093,462.

Like the above-described acid-substituted cellulose derivative the low molecular weight addition polymerizable component of the new compositions of this invention is similarly narrowly and precisely selected and defined, both as to its nature and as to the quantity thereof which can be present in these new compositions. In the first place, there must be at least 10% of this addition polymerizable component which preferably carries a plurality of addition polymerizable ethylenic linkages. Compositions containing smaller quantities have been found either to insolubilize too slowly on light exposure or else not to insolubilize sufficiently to permit adequate and proper development of the printing relief image. On the other hand, compositions of this invention containing more than about 60% by weight of the composition of this low molecular weight addition polymerizable component are likewise unsatisfactory in that at these higher levels the low molecular weight, unsaturated, addition polymerizable component is either incompatible with the acidic cellulose derivative, or else, if compatible due to the concomitant solubilizing or plasticizing action on the acid cellulose derivative, the resulting compositions are soft and tacky and therefore difficult to use in the preparation of relief printing plates. Because of the more rapid insolubilization in shorter exposure times it is desirable to include in the new compositions of this invention as much of this low molecular weight addition polymerizable component as is possible consonant with the achievement of the firm, non-tacky, solid layers desired for use in preparation of relief printing plates. Generally speaking, this addition polymerizable component will preferably be present in amounts of from 20 to 40% based on the composition as a whole.

This low molecular weight addition polymerizable component must have a minimum boiling point of 100° C. at atmospheric pressure and furthermore must form with the acid cellulose derivative a substantially homogeneous and transparent composition. Furthermore, the low molecular weight addition polymerizable component must be compatible with the acid cellulose derivative and the photoinitiator and desirably exhibits plasticizing or solvent action for either or both, especially the former, particularly at elevated temperatures. This addition polymerizable component should generally range from 100 to no greater than about 1500 in molecular weight since materials within this range exhibit the best plasticizing or solubilizing action for the acid cellulose derivatives and accordingly permit fabrication of the desired layers of the new compositions of this invention by conventionally used extrusion or milling techniques. The polymerizable component should contain at least one polymerizable carbon-carbon linkage for every 300 units of molecular weight. The preferred polymerizable components range in molecular weight from about 150 to about 500 and have at least one polymerizable carbon-carbon linkage for each about 100–250 units of molecular weight since they exhibit greater plasticizing action on the acidic cellulose derivative and on exposure polymerize more rapidly to more insoluble polymers.

Chemically this low molecular weight addition polymerizable component should be free of free basic groups capable of interaction with the free acid substituents in the acid cellulose derivative. Desirably, this addition polymerizable component should have at least one terminal vinylidene group per molecule.

Suitable specific such components in addition to those given in the examples include selected esters of α-methylene carboxylic acids, e.g., methyl methacrylate, diethylene glycol acrylate, N(β-hydroxyethyl)methacrylamide, N,N-bis(β-hydroxyethyl)acrylamide, β-acetamidoethyl methacrylate and β-methacrylamidoethyl propionate; selected olefin blends with ethylenic α,β-dicarboxylic acid or esters thereof, e.g., styrene/diethyl fumarate, styrene/diethyl maleate blends; esters of vinylbenzoic acid, e.g., methyl vinylbenzoate and β-hydroxyethyl vinylbenzoate.

Because of their generally more rapid rate of insolubilization on exposure, presumably due to a relatively rapid establishment of a network polymer structure, an outstanding class of the low molecular weight addition polymerizable components are those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen, and sulfur. Outstanding are such materials wherein the ethylenically unsaturated groups, especially the vinylidene groups, are conjugated with ester or amide structures. The following specific compounds are further illustrative of this class: unsaturated esters of polyols, particularly such esters of the α-methylene carboxylic acids, e.g., ethylene diacrylate,
diethylene glycol diacrylate,
glycerol diacrylate,
glycerol triacrylate,
ethylene dimethacrylate,
1,3-propylene dimethacrylate,
1,2,4-butane triol trimethacrylate,
1,4-cyclohexanediol diacrylate,
1,4-benzene-diol dimethacrylate,
pentaerythritol tetramethacrylate,
1,3-propanediol diacrylate,
1,5-pentane-diol dimethacrylate, the bis-acrylates and methacrylates of polyethylene glycols of molecular weight 200–500, and the like; unsaturated amides, particularly those of the α-methylene carboxylic acids, and especially those of alpha, omega-diamines and oxygen-interrupted omega-diamines, such as methylene bis-acrylamide,
methylene bis-methacrylamide,
ethylene bis-methacrylamide,
1,6-hexamethylene bis-acrylamide,
diethylene triamine tris-methacrylamide,
bis(γ-methacrylamidopropoxy)ethane,
β-methacrylamidoethyl methacrylate,
N-(β-hydroxyethyl) - β - (methacrylamido)ethyl acrylate
and N,N-bis(β-methacrylyloxyethyl)acrylamide;

vinyl esters such as divinyl succinate, divinyl adipate, divinyl phthalate, divinyl terephthalate, divinyl benzene-1,3-disulfonate, and divinyl butane-1,4-disulfonate; and unsaturated aldehydes, such as sorbaldehyde (hexadienal). An outstanding class of these preferred addition polymerizable components are the esters and amides of α-methylene carboxylic acids and substituted carboxylic acids with polyols and polyamides wherein the molecular chain between the hydroxyls and amino groups is solely carbon or oxygen-interrupted carbon.

The low molecular weight addition polymerizable ethylenically unsaturated components or compounds referred to above are well known to be capable of forming a high polymer by photoinitiated polymerization in the presence of an addition polymerization initiator therefor activatable by actinic light.

While the above description and working examples disclose the use of cellulose derivatives having lateral free oxyacid groups, the corresponding compounds wherein the acid hydrogen atom or atoms is replaced by an alkali metal, e.g., lithium, sodium or potassium or an ammonium or substituted ammonium salt group are also useful, especially where water alone is to be used as the developing solvent. Thus, the sodium, potassium or ammonium salts of any of the foregoing cellulose derivatives can be made by a simple neutralization reaction with an aqueous solution of sodium, potassium or ammonium hydroxide, or substituted ammonium hydroxide, i.e., to form the substituted amine salts. In the case of these salts development can be achieved with water alone rather than the aqueous base systems. The cellulose derivatives containing the free acid substituents are much preferred since the salts are in general more water-sensitive and even hygroscopic.

By controlling the degree of neutralization, that is, the relative amount of free acid versus salt groups, the nature of the compositions can also be controlled. Thus, as the degree of neutralization increases, i.e., as the number of salt groups increases, so does the solubility of the polymeric component increase in water and, conversely, so does the relative concentration of base needed for development decrease and vice versa. Similarly, as the number of salt groups increases so also does the relative water-sensitivity of the compositions while, conversely, the compatibility of the polymer component with the less water-sensitive polymerizable components decreases.

The aqueous base developing solutions can be those of any of the alkali metal, or ammonium, or substituted ammonium hydroxides. Generally the base will be present in concentrations ranging from about 0.01 to about 10%, although normally solutions greater than about 5% will not be used. In place of the alkali metal hydroxides there can be used the basic reacting salts thereof, especially those of weak acids such as the carbonates, bicarbonates, and acetates. Aqueous solutions of various amines can likewise be used such as those of ethanolamine, diethanolamine and triethanolamine.

In some instances, depending on the aqueous/organic partition solution coefficient for the acidic cellulose derivative or salts thereof, it may frequently be helpful to use minor quantities of organic solvents, e.g., the short chain aliphatic alcohols, short chain aliphatic ketones, and cycloaliphatic ketones. This is advantageous in development of compositions based on acidic cellulose components having rather high neutral degrees of substitution coupled with low acid degrees of substitution. Suitable specific such organic solvents include methanol, ethanol, acetone, and mixtures of such solvents, generally in amounts no greater than 25–35% and preferably less than about 5% of the aqueous developing composition.

In addition to the aforesaid components or mixtures thereof, the photopolymerizable layer can also contain added preformed compatible condensation or addition polymers, e.g., cellulose ethers and esters free from lateral acid or acid salt groups, as well as immiscible polymeric or non-polymeric type of inorganic fillers or reinforcing agents which form essentially transparent compositions, e.g., the organophilic silicas, bentonites, silica, glass, etc., having a particle size less than 0.4 mil in their maximum dimension, and in amounts varying with the desired properties of the photopolymerizable layer. These added constituents can be present in all the foregoing compositions in order to modify their rheological properties, render the photopolymerizable layers even more tack-free, and make the compositions more readily formable into sheets. Since a stiff sheet can be more easily handled in a forming operation, e.g., in preparing a photopolymerizable plate for use in making a printing plate, the use of filler materials giving the requisite stiffness has important commercial advantages.

Mixtures of two, three or more of the foregoing compatible polymers and/or fillers can be used in the photopolymerizable compositions but in general the fillers should not be present in amounts exceeding about 35% by weight of the whole composition. Moreover, with polymeric fillers, amounts up to about 20% by weight of the whole give the best results.

Inert relatively non-volatile liquid plasticizers e.g., triacetin, triethylene glycol dipropionate or diisobutyrate, can be present, e.g., when the composition is too stiff or when low amounts of monomer, e.g., 10–15% by weight of the whole, are present.

As pointed out in the above, the acid cellulose derivative and low molecular weight addition polymerizable component of these new compositions must be very carefully selected. The same is true for the necessary addition polymerization initiator. In the first place, the photoinitiator, i.e., addition polymerization catalyst activatable by actinic light, must be compatible with both the other two necessary components, as well as any other added organic or inorganic fillers or the like, and is preferably soluble in the low molecular weight polymerizable component. In any event, it must be capable of being substantially completely homogeneously distributed throughout the new compositions. In the second place, since most conventional light sources give off both heat and light and since the former is transmitted equally well by the opaque and transparent areas of the image-bearing process transparencies used in the process, the free radical generating, addition polymerization initiators should not be activatable thermally below about 85° C. This is also important since the polymerization itself generates heat some of which is transmitted to areas of the composition outside the exposed areas. In order to preserve ultimate fidelity of the printing image, such transmitted heat should not be permitted to initiate polymerization in the unexposed areas. Precautions can be taken to exclude to some extent the heat rays emanating from the light source and to remove heat buildup caused by polymerization, so as to maintain the photopolymerizable layer at temperatures which are not effective in activating the initiator thermally, but these are obviously troublesome. Furthermore, complete exclusion of input or generated heat makes necessary longer exposure times since the rate of chain propagation in the polymerization reaction is lower at reduced temperatures.

Thus, the free radical generating addition polymerization initiators which must be used in these new compositions are those capable of initiating polymerization under the influence of actinic light which are dispersible in the aforesaid described acid cellulose derivative/lower molecular weight polymerizable component compositions to the extent necessary for initiating the desired polymerization under the influence of the light energy available and which are not active thermally at temperatures below 85° C. The preferred initiators are obviously those which are most rapidly affected by the light energy available in the shortest exposure times to initiate the greatest number of growing polymer chains. These photopolymerization initiators are generally used in amounts of from 0.01 to 5.0% and preferably from 0.1 to 2.0%, based on the weight of the polymerizable component. Suitable such initiators include vicinal ketaldonyl compounds, such as diacetyl, benzil, etc.; α-ketaldonyl alcohols, such as benzoin, pivaloin, etc.; acyloin ethers, such as benzoin methyl or ethyl ethers, etc.; α-hydrocarbon substituted aromatic acyloins, including α-methylbenzoin, α-allylbenzoin, and α-phenylbenzoin. The acyloin ethers are especially outstanding.

Most of the low molecular weight polymerizable components discussed previously, including both the mono- and poly-ethylenically unsaturated compounds, will normally contain, as obtained commercially, minor amounts (about 50–100 parts per million by weight) of polymerization inhibitors so as to prevent spontaneous polymerization before desired. The presence of these inhibitors, which are usually of the anti-oxidant type, e.g., hydroquinone, tertiary butyl catechols and the like in such amounts causes substantially no undesirable results in the photopolymerizable layers of this invention either as to speed or quality of polymerization. In fact, larger quantities of such inhibitors, e.g., of the order of 200–500 parts per million can easily be tolerated and may be advantageous in tending to reduce unwanted polymerization in nonexposed, i.e., non-image areas.

The photopolymerizable compositions of this invention are also suitable for other purposes in which readily insolubilized, solid, addition polymerizable compositions are useful, such as binders for television phosphors, in producing ornamental effects and plastic articles of various types. They are useful in making multicolor television screens by the photopolymerization procedures described in assignee's Swindells U. S. application Ser. No. 373,753, filed Aug. 12, 1953.

The printing reliefs made in accordance with this invention can be used in all classes of printing but are most applicable to those classes of printing wherein a distinct difference of height between printing and non-printing areas is required. These classes include those wherein the ink is carried by the raised portion of the relief such as in dry-offset printing, ordinary letterpress printing, the latter requiring greater height differences between printing and non-printing areas, and those wherein the ink is carried by the recessed portions of the relief such as in intaglio printing, e.g., line and inverted half-tone. The plates are obviously useful for multicolor printing.

An advantage of this invention is that it provides photopolymerizable compositions which are economical and produce hard, sharp relief images. A further advantage is that the compositions and layers made therefrom are quite soluble in water or aqueous alkaline solutions. This means that in the making of printing reliefs by photopolymerization the unexposed and unpolymerized portion of the layer can be removed by means of aqueous solutions which are low in cost and non-toxic. Moreover, solvent recovery equipment which is expensive and requires considerable space is not necessary. Another advantage is that the printing reliefs made in accordance with the invention are not affected by printing inks and cleaning solutions. Still other advantages will be apparent to those skilled in the art.

What is claimed is:

1. A photopolymerizable element comprising a support and a photosensitive layer comprising (1) a small amount of a compatible addition polymerization initiator activatable by actinic light and not active thermally below 85° C., (2) a compatible addition polymerizable ethylenically unsaturated compound having a boiling point at normal pressure over 100° C., a molecular weight less than 1500 and containing at least one polymerizable ethylenic group for every 300 units of molecular weight and capable of forming a high polymer by photoinitiated addition polymerization in the presence of an addition polymerization initiator therefor activatable by actinic light, and (3) an essentially linear cellulose derivative of high molecular weight having the cellulose structure and containing at least 50 combined glucose units in the polymer chain of atoms, taken from the group consisting of cellulose phosphates, cellulose sulfates, and cellulose ethers and cellulose carboxyic acid esters containing a free acid group taken from the class consisting of carboxylic and sulfonic acid groups, and the alkali metal and ammonium salts of said cellulose compounds, said derivatives having a total degree of substitution in the range 2.0 to 3.0 per glucose unit, the total number of hydroxyl groups in said derivative, including any acid hydroxyl groups, being in the range 0.5 to 2.5 per glucose unit, there being sufficient lateral such groups so that said derivative when in acid form has a neutral equivalent in the range 200 to 700, said cellulose derivative being soluble to the extent of at least 10% by weight in 1% aqueous ammonia solution, and said initiator being present in an amount from about 0.01 to about 5.0% by weight of the total composition, said unsaturated compound constituting about 10% to about 60% by weight and said cellulose derivative constituting about 40% to about 90% by weight of the total composition exclusive of initiator.

2. A photopolymerizable element as set forth in claim 1 wherein said layer is 3 to 250 mils in thickness.

3. A photopolymerizable element as set forth in claim 2 wherein said layer contains inert filler material essentially transparent in the composition in an amount from 5 to 20% by weight.

4. A photopolymerizable element as set forth in claim 2 wherein said unsaturated compound is a monomer containing at least two ethylenic groups.

5. A photopolymerizable element as set forth in claim 2 wherein said unsaturated compound is an acrylic acid diester of a polyethylene glycol.

6. A photopolymerizable element comprising a support and a photosensitive layer comprising (1) a small amount of a compatible addition polymerization initiator activatable by actinic light and not active thermally below 85° C., (2) a compatible addition polymerizable ethylenically unsaturated compound having a boiling point at normal pressure over 100° C., a molecular weight less than 1500 and containing at least one polymerizable ethylenic group for every 300 units of molecular weight and capable of forming a high polymer by photoinitiated addition polymerization in the presence of an addition polymerization initiator therefor activatable by actinic light, and (3) an essentially linear carboxylic acid ester of cellulose of high molecular weight having the cellulose structure and containing at least 50 combined glucose units in the polymer chain of atoms and containing lateral free carboxylic acid groups linked to the cellulose carbon atoms through carboxylic acid ester groups, said cellulose ester having a total degree of substitution in the range 2.0 to 3.0 per glucose unit, the total number of hydroxyl groups, including acid hydroxyl groups, being in the range 0.5 to 2.5 per glucose unit, there being sufficient lateral free acid groups so that said ester has a neutral equivalent in the range 200–700, said cellulose ester being soluble to the extent of at least 10% by weight in 1% aqueous ammonia solution, and said initiator being present in an amount from about 0.01% to about 5.0% by weight of the total composition, said unsaturated compound constituting about 10% to about 60% by weight and said cellulose ester constituting about 40% to about 90% by weight of the total composition exclusive of initiator.

7. A photopolymerizable element as set forth in claim 6 wherein said derivative is a cellulose acetate/hydrogen phthalate.

8. A photopolymerizable element as set forth in claim 6 wherein said derivative is a cellulose acetate/hydrogen maleate.

9. A photopolymerizable element as set forth in claim 6 wherein said derivative is a cellulose acetate/hydrogen succinate and said unsaturated compound is triethylene glycol dimethacrylate.

10. A photopolymerizable element as set forth in claim 6 wherein said derivative is a cellulose acetate/butyrate/hydrogen succinate.

11. The process of making a relief which comprises exposing to actinic light selected portions of a photopolymerizable element comprising a support and a photosensitive layer comprising (1) a small amount of a compatible addition polymerization initiator activatable by actinic light and not active thermally below 85° C., (2) a compatible addition polymerizable ethylenically unsaturated compound having a boiling point at normal pressure over 100° C., a molecular weight less than 1500 and containing at least one polymerizable ethylenic group for every 300 units of molecular weight and capable of forming a high polymer by photoinitiated addition polymerization in the presence of an addition polymerization initiator therefor activatable by actinic light, and (3) an essentially linear cellulose derivative of high molecular weight having the cellulose structure and containing at least 50 combined glucose units in the polymer chain of atoms, taken from the group consisting of cellulose phosphates, cellulose sulfates, and cellulose ethers and cellulose carboxylic acid esters containing a free acid group taken from the class consisting of carboxylic and sulfonic acid groups, and alkali metal and ammonium salts of said cellulose compounds, said derivatives having a total degree of substitution in the range 2.0 to 3.0 per glucose unit, the total number of hydroxyl groups in said derivative, including any acid hydroxyl groups, being in the range 0.5 to 2.5 per glucose unit, there being sufficient such groups that said derivative when in acid form has a neutral equivalent in the range 200 to 700, said cellulose derivative being soluble to the extent of at least 10% by weight in 1% aqueous ammonia solution, and said initiator being present in an amount from about 0.01% to about 5.0% by weight of the total composition, said unsaturated compound constituting about 10% to about 60% by weight and said cellulose derivative constituting about 40% to about 90% by weight of the total composition exclusive of initiator, and removing the unexposed portions of said layer by dissolving them in a solvent therefor selected from the group consisting of water and water containing an alkaline material.

12. The process of making a printing relief which comprises exposing to actinic light through a transparency having light-opaque areas of the same optical density and transparent areas which are of the same optical density, a photopolymerizable element as set forth in claim 2, and removing the unexposed portions of said layer with an aqueous solution containing an alkaline material.

13. An element as set forth in claim 1 in which the photosensitive layer has an optical density of less than 5 and less than 0.5 per mil at wavelengths above 3000 A. of actinic light.

References Cited in the file of this patent

UNITED STATES PATENTS

| | | |
|---|---|---|
| 2,336,985 | Freund | Dec. 14, 1943 |
| 2,544,905 | Van Deusen | Mar. 13, 1951 |
| 2,760,863 | Plambeck | Aug. 28, 1956 |

FOREIGN PATENTS

| | | |
|---|---|---|
| 618,181 | Great Britain | Feb. 17, 1949 |